United States Patent [19]

Hanazawa et al.

[11] Patent Number: 5,204,543
[45] Date of Patent: Apr. 20, 1993

[54] LATERAL TYPE SEMICONDUCTOR DEVICE HAVING A STRUCTURE FOR ELIMINATING TURNING-ON OF PARASITIC MOS TRANSISTORS FORMED THEREIN

[75] Inventors: Toshio Hanazawa, Kasugai; Yukinori Fujimura, Owariasahi; Takashi Matsumoto, Inazawa, all of Japan

[73] Assignees: Fujitsu Limited, Kawasaki; Fujitsu VSLI Limited, Kasugai, both of Japan

[21] Appl. No.: 918,117

[22] Filed: Jul. 22, 1992

Related U.S. Application Data

[63] Continuation of Ser. No. 831,638, Feb. 10, 1992, abandoned, which is a continuation of Ser. No. 501,751, Mar. 30, 1990, abandoned.

[30] Foreign Application Priority Data

Mar. 30, 1990 [JP] Japan .................................... 1-81918

[51] Int. Cl.$^5$ ..................... H01L 27/02; H01L 29/72; H01L 29/78
[52] U.S. Cl. .................................. 257/378; 257/566; 257/577; 257/587
[58] Field of Search .................. 357/23.14, 35, 43, 20; 307/499, 570

[56] References Cited

U.S. PATENT DOCUMENTS

| 3,436,623 | 4/1964 | Beer ................. | 357/23.14 |
| 3,633,078 | 10/1969 | Dill et al. ............ | 357/23.14 |
| 3,858,235 | 12/1974 | Schild ................ | 357/35 |
| 4,024,564 | 5/1977 | Shimada et al. | |
| 4,306,352 | 12/1981 | Schrader ............ | 357/23.14 |
| 4,321,616 | 3/1982 | Bise .................. | 357/51 |
| 4,672,423 | 6/1987 | Fowler et al. ..... | 357/23.14 |
| 4,716,446 | 12/1987 | Esser et al. ....... | 357/23.14 |
| 4,786,961 | 11/1988 | Avery ............... | 357/33 |

FOREIGN PATENT DOCUMENTS 0347479 12/1989 European Pat. Off. .
0228387 10/1985 Fed. Rep. of Germany ... 357/23.14
2282723 3/1976 France .
55-88372 7/1980 Japan .
61-290767 12/1986 Japan ................................. 357/23.14
63-132478 6/1988 Japan ................................. 357/23.14
1159937 7/1969 United Kingdom .

OTHER PUBLICATIONS

Laibowitz et al, "High-Frequency Field-Effect Transistor", IBM Technical Disclosure Bulletin, vol. 14, No. 5, Oct. 1971.

Primary Examiner—Jerome Jackson, Jr.
Assistant Examiner—Ngan Van Ngo
Attorney, Agent, or Firm—Staas & Halsey

[57] ABSTRACT

A semiconductor device comprises a substrate of a first conduction type defined by a major surface, a pair of conductive regions of a second conduction type formed in the substrate along the major surface, an intervening region of the first conduction type formed in the substrate between the pair of conductive regions so as to separate the pair of conductive regions from each other, a first insulator film provided on the substrate so as to cover the major surface thereof including the pair of conductive regions and the intervening region located therebetween, a first conductor layer provided so as to extend generally parallel to the major surface of the substrate with a separation from the first insulator film, the first conductor layer crossing a part of the intervening region at a level separated therefrom, a second conductor layer provided on the first insulator film at a level below the first conductor layer so as to cover at least the part of the intervening region which is crossed by the first conductor layer, a second insulator film interposed between the second conductor layer and the first conductor layer, and a circuit for applying a predetermined voltage to the second conductor layer, the predetermined voltage having a magnitude chosen such that turning-on of a parasitic MOS transistor formed in the semiconductor device is eliminated.

3 Claims, 6 Drawing Sheets

LATERAL TYPE SEMICONDUCTOR DEVICE HAVING A STRUCTURE FOR ELIMINATING TURNING-ON OF PARASITIC MOS TRANSISTORS FORMED THEREIN

This application is a continuation in part, of application Ser. No. 07/831,638, filed Feb. 10, 1992, now abandoned which is a continuation of application Ser. No. 07/501,751, filed Mar. 30, 1990, now abandoned.

BACKGROUND OF THE INVENTION

The present invention generally relates to semiconductor devices and more particularly to a lateral type semiconductor device having a plurality of diffusion regions of first and second conduction types along a top surface of a substrate.

In the so-called lateral type semiconductor devices such as a lateral pnp-transistor or resistors, a first diffusion region of a first conduction type and a second diffusion region of a second conduction type are formed alternately along the top surface of a substrate.

FIG. 1 shows a typical circuit diagram of such a lateral pnp-transistor in which the collector and the base are shorted to form a lateral pnp-diode. FIG. 2 shows a plan view of such a lateral pnp-diode formed on a substrate and FIG. 3 shows a cross-sectional view of the lateral pnp-diode of FIG. 2 taken along a line 3—3' of FIG. 2.

Referring to FIGS. 2 and 3, the lateral pnp-diode is formed within an n-type epitaxial layer 3 which is grown epitaxially on a p-type substrate 1. The n-type epitaxial layer 3 is formed with a plurality of isolation regions 4 repeated with a predetermined interval, and a lateral pnp-transistor forming the diode, is formed in a device region of the epitaxial layer 3 defined by a pair of such isolation regions 4. In correspondence to the device region thus defined, there is formed also a buried layer 2 of the n-type at a boundary between the substrate 1 and the epitaxial layer 3.

In the epitaxial layer 3, a p-type diffusion region 5 acting as the emitter of the lateral pnp-transistor is formed generally in correspondence to the central part of the device region, and another p-type diffusion region 6 acting as the collector is formed so as to surround the emitter region 5. Further, an n+-type diffusion region 7 with an impurity concentration level exceeding the impurity concentration of the n-type epitaxial layer 3, is formed in a region of the epitaxial layer 3 outside the region surrounded by the collector 6 as a base contact region of the lateral pnp-transistor. This base contact region 7 contacts with the n-type epitaxial layer 3 which acts as the base of the pnp-transistor at a part of the layer 3 located between the emitter 5 and the collector 6. Further, an insulator layer 8 is provided on the epitaxial layer 3 so as to bury the emitter region 5, collector region 6 and the base contact region 7, and a collector conductor pattern 9 and an emitter conductor pattern 10 are provided on the insulator layer 8. It should be noted that the collector conductor pattern 9 is connected commonly to the collector region 6 and the base contact region 7, and thus, the lateral pnp-transistor forms a lateral pnp-diode having the circuit diagram shown in FIG. 1. On the other hand, the emitter conductor pattern 10 crosses the collector region 6 at a level above the level of the collector region 6.

In such a pnp-lateral diode, there occurs a problem such that parasitic MOS transistors are formed between the p-type isolation region 4 acting as a source and the p-type collector region 6 acting as a drain with the intervening epitaxial region 3 acting as the channel region, and further between the p-type collector region 6 acting as a drain and the emitter region 5 acting as a source with the intervening epitaxial region 3 acting as the channel region as shown in FIG. 3. In any of these parasitic MOS transistors, the insulator layer 8 acts as the gate oxide film and the collector conductor pattern 10 acts as the gate electrode.

FIG. 4 shows an equivalent circuit diagram of the structure of FIG. 3 including these parasitic MOS transistors. As can be seen in the equivalent circuit diagram, the parasitic transistors form a single MOS transistor 11 of multiple source construction. This parasitic MOS transistor 11 of FIG. 4 operates as an enhancement mode MOS transistor and is turned on when the voltage level at the collector conductor pattern 9 and thus the voltage level at the collector region 6 has exceeded the voltage level of the emitter region 5 by a threshold voltage pertinent to the MOS transistor 11. In other words, when the lateral pnp-diode is biased in the reverse direction with a reverse voltage level exceeding the threshold voltage of the parasitic MOS transistor 11, a leak current flows from the collector region 6 to the isolation region 4 and further from the collector region 6 to the emitter 5 and thus, the lateral pnp-diode causes a breakdown.

In order to avoid this problem of poor breakdown characteristic, there is a proposal to provide an n+-type diffusion region 12 between the collector region 6 and the p-type isolation region 4 with an increased impurity concentration level as shown in FIG. 5. The n+-type diffusion region 12 thus provided interrupts the flow of holes through the channel region between the source region 4 and the drain region 5, and the formation of the parasitic MOS transistor in this region is substantially eliminated.

However, this approach to eliminate the parasitic MOS transistor is incomplete, as only one of the MOS transistors forming the parasitic MOS transistor 11 is eliminated while the other of the MOS transistors forming the MOS transistor 11 is left as it is without any change between the collector region 6 and the emitter region 5. The provision of a doped region between the collector region 6 and the emitter region 5 similarly to the doped region 12 would cause a disastrous result in the performance of the bipolar transistor, as this region between the collector region 6 and the emitter region 5 is used for the base of the pnp-transistor and is critical to the operational characteristic of the transistor.

Further, such a provision of the additional diffusion region is undesirable from the view point of increasing the integration density and hence the operational speed of the device. It is needless to say that the provision of another doped region similar to the region 12 between the collector region 6 and the emitter region 5 causes an unnecessary increase of the size of the semiconductor device.

SUMMARY OF THE INVENTION

Accordingly, it is a general object of the present invention to provide a novel and useful lateral type semiconductor device wherein the foregoing problems are eliminated.

Another object of the present invention is to provide a lateral type semiconductor device comprising a substrate formed with a first conductive semiconductor region of a first conduction type and a pair of second conductive semiconductor regions of a second conduction type disposed at both sides of the first region along a surface thereof, a first insulator layer provided on the substrate so as to cover the first and second regions, a first conductor pattern provided on the first insulator layer at least in correspondence to a part thereof located above said first region, a second insulator layer provided on the first insulator layer including the first conductor pattern, and a second conductor pattern provided on the second insulator layer so as to extend along the second insulator layer, crossing the first conduction pattern, and connected electrically to one of said second diffusion regions, wherein the turning-on of a parasitic MOS transistor, formed between the pair of second conductive semiconductor regions acting respectively as the source and drain with the first conductive semiconductor region acting as the channel region and the second conductor pattern acting as the gate electrode, is effectively suppressed by applying a predetermined voltage to the first conductor pattern such that the voltage across the gate and the source of the parasitic MOS transistor is held smaller than the threshold voltage of the MOS transistor.

According to the present invention, the turning-on of the parasitic MOS transistor is effectively suppressed. Further, as the semiconductor device has a two-layer conductor structure wherein the first conductor pattern and the second conductor pattern are provided at respective levels, the feeding of the predetermined voltage to the first conductor pattern can be made irrespective of the configuration of the second conductor pattern. For example, the first conductor pattern can be provided immediately below the second conductor pattern and the turning-on of the parasitic MOS transistor can be suppressed effectively. Further supply of the predetermined voltage to the first conductor pattern can be made from any convenient voltage source nearby without being obstructed by the second conductor pattern.

Particularly, when the second conductive semiconductor regions are connected to form a collector region surrounding the first conductive semiconductor region, which first conductive semiconductor region thereby acting as a base region, and when a third conductive semiconductor region acting as an emitter region is formed further generally at the center of the first conductive semiconductor region such that the semiconductor device forms a lateral bipolar transistor, it is possible to enclose the base region completely by the collector region without causing the turning-on of the parasitic MOS transistor which otherwise would be caused by the emitter voltage supplied to the emitter region through the second conductor pattern. Because the collector region surrounds the base region completely, the efficiency of carrier injection is improved significantly without inducing the turning-on of the parasitic MOS transistor.

Other objects and further features of the present invention will become apparent from the following detailed description on the preferred embodiments when read in conjunction with the attached drawings.

DETAILED DESCRIPTION

Figure 6:
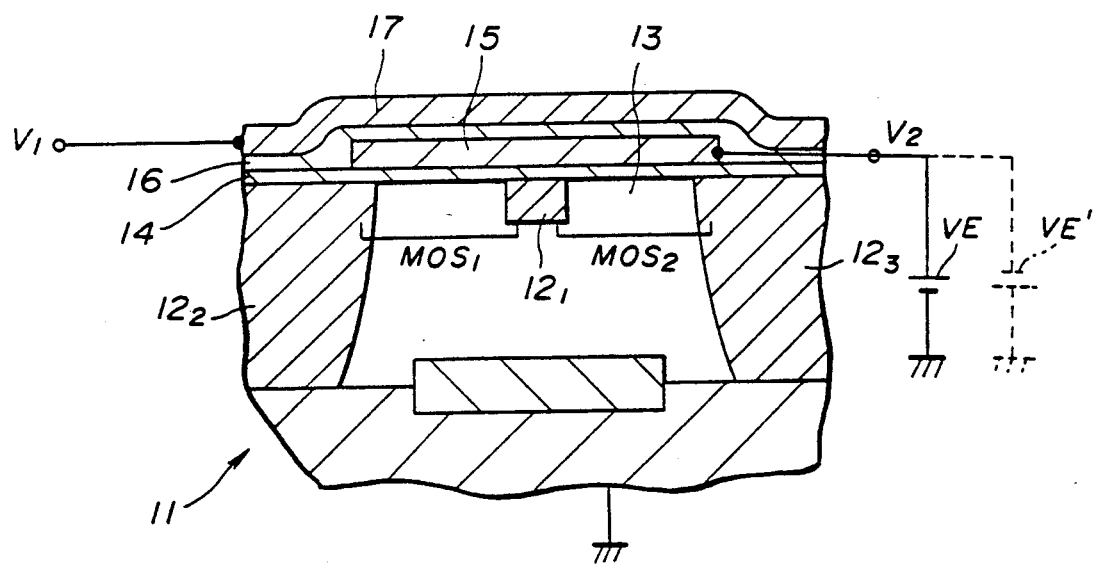
FIG. 6 is a cross-sectional view showing the principle of the semiconductor device of the present invention.

FIG. 6 shows the principle of the present invention. In this drawing, the illustrated structure is not for a specific device and various active devices such as lateral bipolar transistors or diodes or other devices such as resistors may be formed on the structure of FIG. 6.

Referring to FIG. 6, the structure comprises a substrate 11 formed therein with a plurality of first doped regions $12_1$, $12_2$, $12_3$ of a first conduction type and a second doped region 13 of a second conduction type such that the first and second doped regions are disposed alternately along the surface of the substrate 11. In the illustrated example, there is one such first doped region $12_1$ in the second doped region 13 in a manner isolated from other first doped regions $12_2$ and $2_3$, and the second doped region 13 is laterally bounded by the first doped regions $12_2$ and $12_3$. A first insulator layer 14 is provided on the substrate 11 so as to cover the first and second doped regions $12_1$ –$12_3$ and 13, and a first conductor pattern 15 is provided on the first insulator layer 14 so as to cover at least the second doped region 13. Further, a second insulator layer 16 is provided on the first conductor pattern 15, and a second conductor pattern 17 is provided on the second insulator layer 16 so as to extend above the first doped regions $12_1$–$12_3$, passing over the second diffusion region 13. In such a structure, there are formed parasitic MOS transistors MOS1 and MOS2 respectively between the first doped region $12_1$ and another first doped region $12_2$, and between the first doped region $12_1$ and another first doped region $12_3$. Thereby, the first insulator layer 14 and the second insulator layer 16 act as the gate oxide film and the first and second conductor patterns 15 and 17 act as the gate electrodes.

In the present invention, the turning-on of these parasitic MOS transistors MOS1 and MOS2, caused in response to a voltage $V_1$ applied to the second conductor pattern 17, is eliminated by applying a predetermined voltage $V_2$ to the first conductor pattern 15 from a suitable voltage source VE or VE'.

For example, when the first diffusion regions $12_1$–$12_3$ are doped to the p-type and the second diffusion region 13 is doped to the n-type, the tendency that the parasitic MOS transistors MOS1 and MOS2 are turned on in response to the low voltage such as the ground level voltage or negative voltage applied to the second conductor pattern 17, is eliminated by applying the voltage $V_2$, set such that the voltage across the gate and the source of the parasitic MOS transistor becomes smaller than the threshold voltage of the parasitic MOS transistor, to the first conductor pattern 15 from the voltage source VE. This condition is readily met when the first conductor pattern 15 is connected directly to one of the regions $12_1$–$12_3$ acting as the source of the parasitic MOS transistor.

A similar relation also holds when the first diffusion regions $12_1$–$12_3$ are doped to the n-type and the second diffusion region 13 is doped to the p-type, except that the polarity of the voltage applied to the various parts of FIG. 6 is reversed. Thus, the voltage $V_2$ is now supplied to the conductor 15 from the voltage source VE' with a negative polarity.

Figure 5:
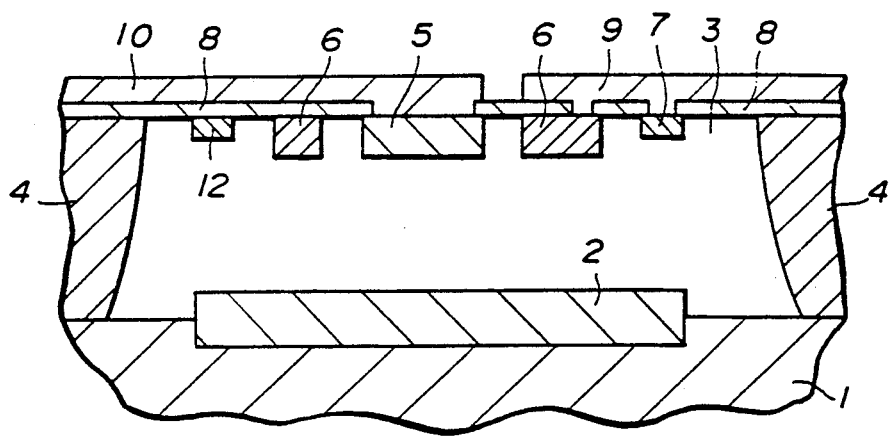
FIG. 5 is a cross-sectional view showing a prior art construction for eliminating the parasitic MOS transistor.

According to the present invention, use of the doped region 12 as in the case of the prior art device shown in FIG. 5 is eliminated, and thereby the turning-on of both of the MOS transistors MOS1 and MOS2 is eliminated without increasing the size of the semiconductor device. As the level of the first conductor pattern and the level of the second conductor pattern are different, the voltage $V_2$ to be supplied to the first conductor pattern for elimination of the turning-on of the parasitic MOS transistors is easily obtained from a nearby conductor without being obstructed by the second conductor pattern which may be an essential part of the active device formed on the semiconductor device of FIG. 6.

Next, a first embodiment of the present invention will be described with reference to FIGS. 7 and 8.

Figure 3:
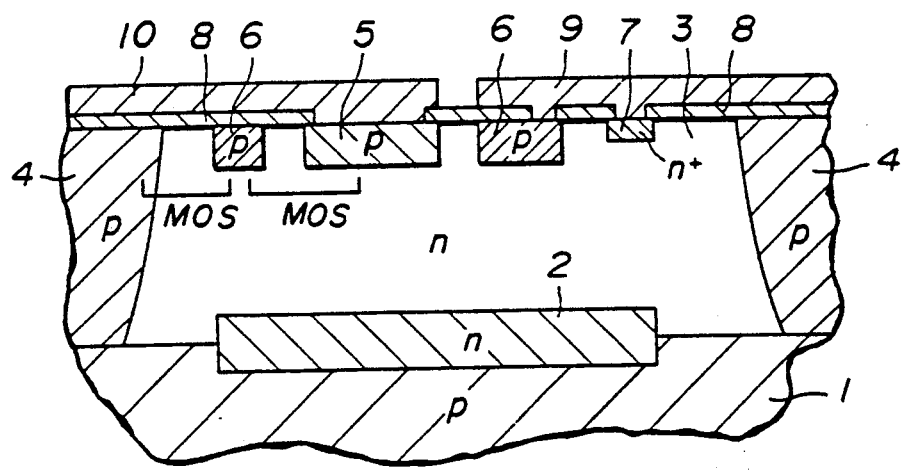
FIG. 3 is a cross-sectional view showing the construction of the diode of FIG. 1 on the semiconductor substrate taken along a line 3'3' of FIG. 2.
Figure 4:
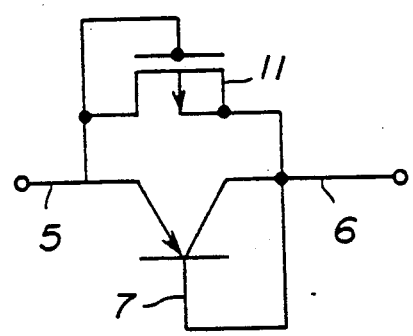
FIG. 4 is an equivalent circuit diagram showing a parasitic MOS transistor formed across the diode in the prior art construction of FIGS. 2 and 3.
Figure 7:
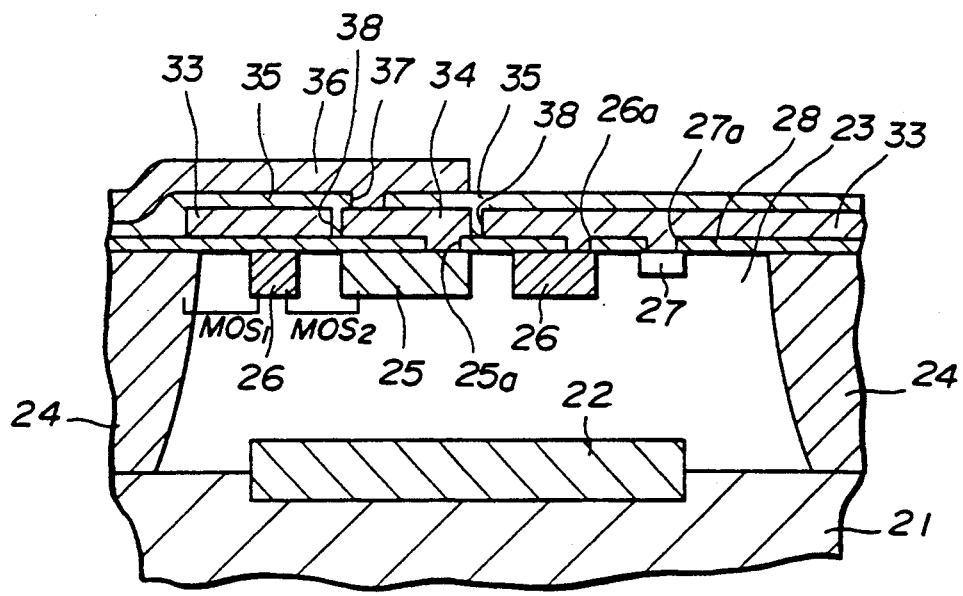
FIG. 7 is a cross-sectional view showing the semiconductor device according to a first embodiment of the present invention.
Figure 8:
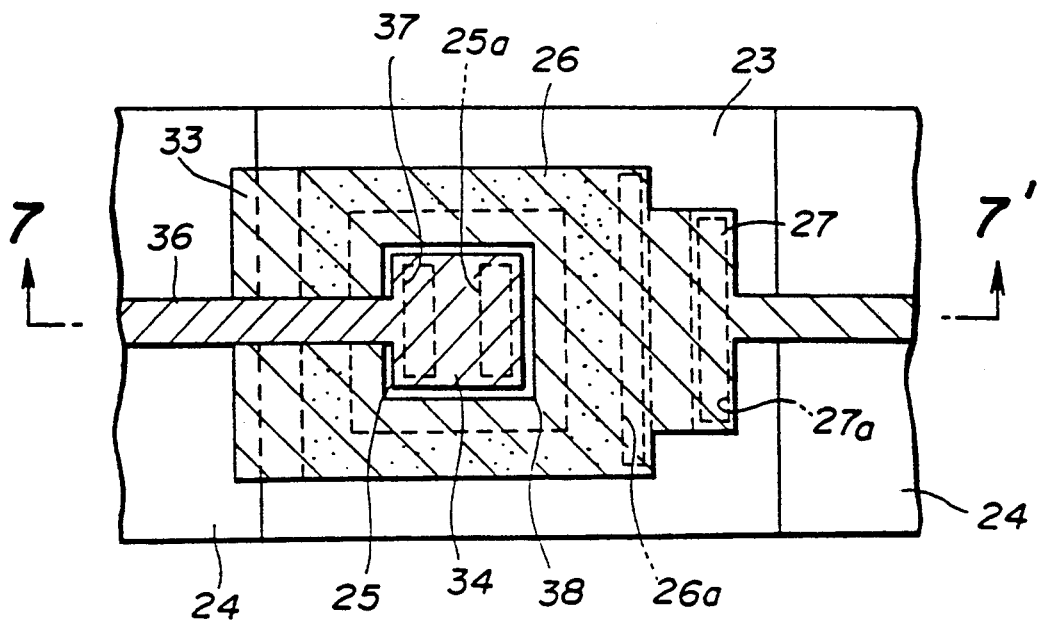
FIG. 8 is a plan view showing the semiconductor device of FIG. 7.

Referring to FIG. 7 showing a cross-sectional view of the structure of FIG. 8 taken along a line 7-7', the semiconductor device is a lateral pnp-transistor formed on a substrate 21. Similarly to the prior art device of FIG. 3, the lateral pnp-transistor is formed within an epitaxial layer 23 doped to the n-type and grown epitaxially on the silicon substrate 21. In the epitaxial layer 23, a pair of p-type isolation regions 24 are formed for device isolation, and a p-type diffusion region 25 corresponding to the emitter of the lateral pnp-transistor and another p-type diffusion region 26 corresponding to the collector of the lateral pnp-transistor, are formed in a device region defined by the isolation regions 24.

As can be seen in the plan view of FIG. 8, the collector region 26 is provided so as to surround the emitter region 25 completely, and the part of the n-type epitaxial layer 23, bounded laterally by the emitter region 25 and the collector region 26, acts as the base of the pnp-transistor. Further, a base contact region 27 of the n+-type is formed in the epitaxial layer 23 in correspondence to the outside of the region surrounded by the collector region 26.

The epitaxial layer 23 is covered by a thin insulator film 28 except for those portions covering the base contact region 27 and further except for a part of the collector region 26, and a contact hole 27a and another contact hole 26a are formed in the insulator film 28 in correspondence to the regions 27 and 26, respectively. Further, the insulator film 28 is formed with another contact hole 25a in correspondence to the emitter region 25 so as to expose a part of the emitter region 25.

Figure 1:
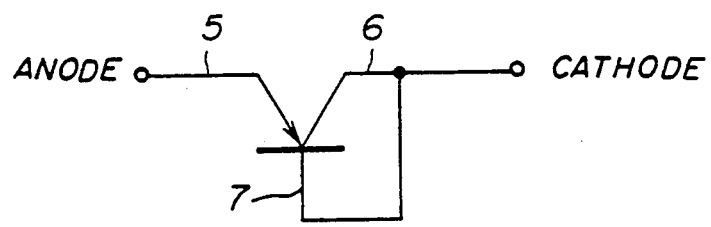
FIG. 1 is a circuit diagram showing a typical pnp-transistor connected to form a diode.
Figure 2:
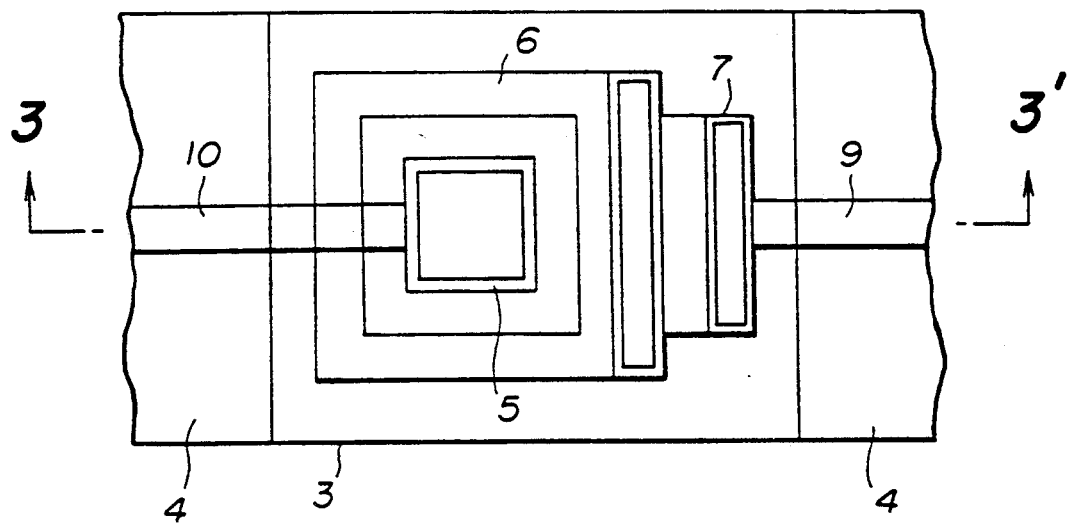
FIG. 2 is a plan view showing a conventional construction of the diode of FIG. 1 on a semiconductor substrate.

Further, a first conductor pattern 33 is provided on the first insulator film 28 such that the first conductor pattern 33 is contacted to the base contact region 27 and the collector region 26 respectively at the contact holes 26a and 27a. As the base and collector are connected commonly by the first conductor pattern 33, the lateral pnp-transistor operates as a pnp-diode similar to the one shown in FIG. 1. FIG. 8 shows the first conductor pattern 33 in the plan view. As can be seen in FIG. 8, the first conductor pattern 33 has a central cutout 38, and a generally rectangular electrode piece 34 is provided in correspondence to the central cutout 38. This electrode piece 34 is provided at a level substantially identical to the level of the first conductor pattern 33, and is contacted to the emitter region 25 at the contact hole 25a as illustrated in FIG. 7.

Further, a second insulator film 35 is provided so as to cover the first conductor pattern 33 as well as the electrode piece 34, and a contact hole 37 is formed in the second insulator film 35 so as to expose a part of the electrode piece 34. On the second insulator film 35, a second conductor pattern 36 is provided so as to make a contact to the electrode piece 34 at the contact hole 37. Thus, the second conductor pattern 36 is contacted to the emitter region 25 in the epitaxial layer 23 via the electrode piece 34. As will be noted in the cross-sectional view of FIG. 7, there are formed parasitic MOS transistors between the isolation region 24 and the collector region 26 and between the collector region 26 and the emitter region 25, respectively.

Figure 9:
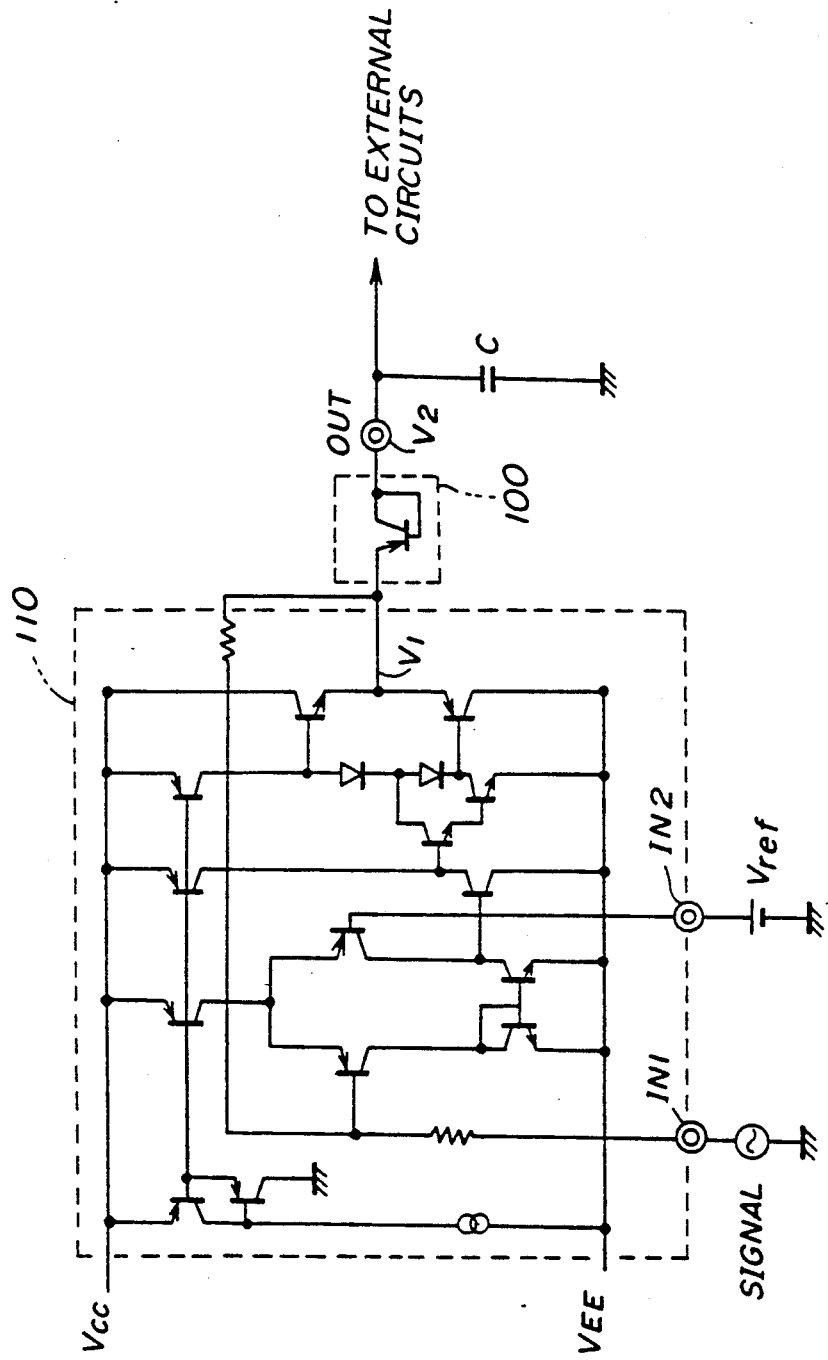
FIG. 9 is a circuit diagram showing an example of use of the semiconductor device of FIG. 7.

FIG. 9 shows an example of use of the lateral pnp-diode of FIG. 7 in combination with a voltage inversion and amplification circuit 110, for producing a predetermined, constant voltage. In this circuit 110, an input signal at a first input terminal IN1 is inverted and supplied to an external capacitor C, after amplification, passing through a pnp-diode 100 having the construction of FIG. 7 and further through an output terminal OUT, provided that the input signal at the first input terminal IN1 is lower than a reference voltage $V_{ref}$ supplied to a second input terminal IN2. When the input voltage at the input terminal IN1 has exceeded the reference voltage $V_{ref}$, no output is supplied to the capacitor C. Thus, when a low input voltage $V_{OL}$ lower than the voltage $V_{ref}$ is supplied to the input terminal IN1, the capacitor C is charged to a voltage of $V_{OL} - V_D$ wherein $V_D$ represents the voltage drop caused by the pnp-diode 100.

At the time of charging the capacitor C as such, there occurs a case in which the voltage at the input terminal IN1 changes from the level $V_{OL}$ to a level $V_{OH}$ which exceeds the reference voltage $V_{ref}$. When such a transition of the input voltage occurs, the output voltage at the output terminal OUT disappears, and a large reverse voltage which can have a value of $V_{OH} - V_D - V_{OL}$ in the maximum is applied to the pnp-diode 100. When the parasitic MOS transistors as shown in FIG. 7 are turned on in this state, the capacitor C is discharged and the circuit of FIG. 9 can no longer provide a stabilized output at the capacitor C. When the source voltages $V_{CC}$ and $V_{EE}$ are set to be 18 volts and $-5$ volts respectively, and when the voltages $V_{OH}$ and $V_{OL}$ are respectively set to be 17 volts and $-4$ volts with the voltage drop $V_D$ of 0.7 volts, this reverse voltage can become as large as 20.3 volts.

Referring again to FIG. 7, when there appears such a large reverse voltage across the pnp-diode 100, this reverse voltage is applied to the first conductor pattern 33 which covers the epitaxial layer 23 including the region where the parasitic MOS transistors MOS1 and MOS2 are formed. It should be noted that this high reverse bias voltage is not only applied to the first conductor pattern 33 acting as the gate of the parasitic MOS transistor but also to the p-type diffusion region 26 acting as the source, via the contact hole 26a. Thus, the gate-source voltage is maintained zero and the turning-on of the MOS transistor does not occur even a low voltage is applied to the second conductor pattern 36 in correspondence to the large reverse voltage.

Referring to FIG. 6, the voltage $V_{OH}-V_D-V_{OL}$ corresponds to the voltage $V_2$ and the voltage $V_{OL}$ corresponds to the voltage $V_1$. Further, the circuit 110 acts as the voltage source VE.

It should be noted that the construction of FIG. 7 does not require any extra-interconnection or modification of the construction for supplying the high voltage to the first conductor pattern 35 covering the parasitic MOS transistors because of the two-layer construction using the first and second interconnection conductors 35 and 36. Further, it should be noted that such a construction does not use the conventionally used doped region such as the region 12 (FIG. 5) for interrupting the channel and the problem of unnecessary increase of the size of the semiconductor device is avoided.

Figure 10:
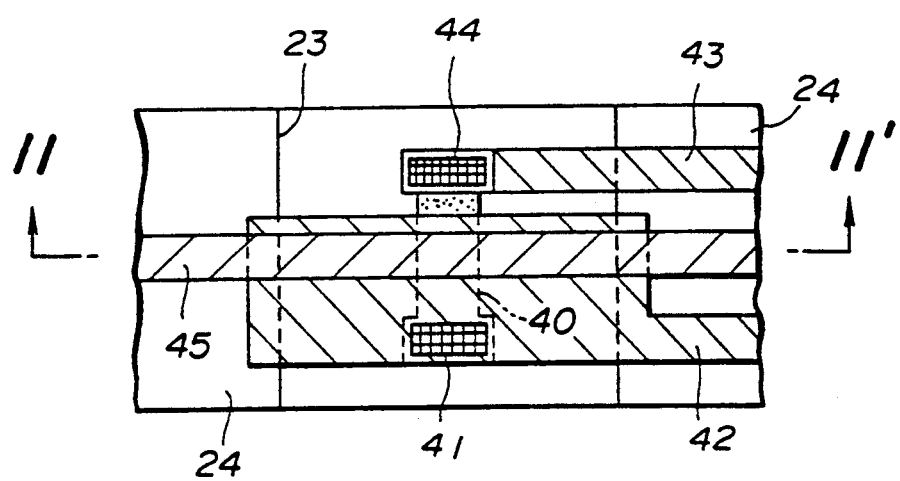
FIG. 10 is a plan view showing the semiconductor device according to a second embodiment of the present invention.
Figure 11:
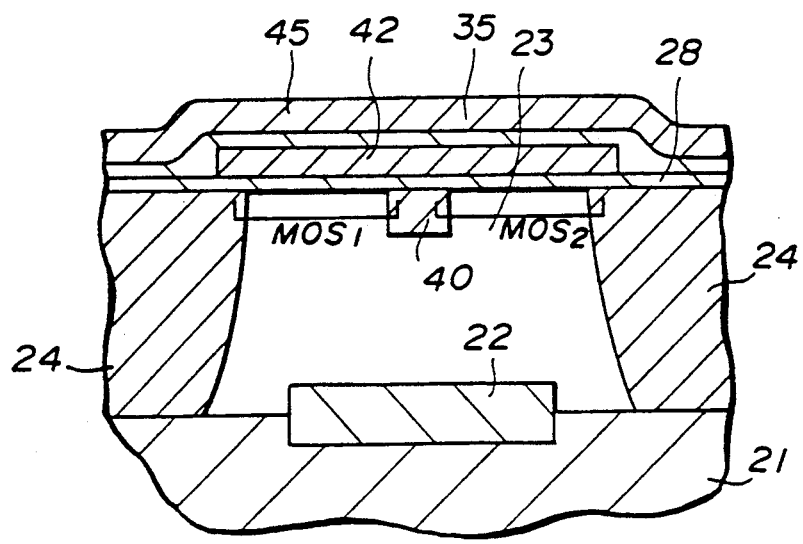
FIG. 11 is a cross-sectional view showing the semiconductor device of FIG. 10.

Next a second embodiment of the semiconductor device of the present invention will be described with reference to FIGS. 10 and 11. In FIGS. 10 and 11, the parts corresponding to the parts already described are given identical reference numerals and the description thereof will be omitted.

Referring to FIG. 10 showing a plan view of the present embodiment, a p-type resistance region 40 is formed generally in correspondence to the center of the epitaxial layer 23, and a positive side conductor pattern 42 and a negative side conductor pattern 43 are provided on the insulator film 28 as illustrated. These conductor patterns 42 and 43 are connected to respective ends of the resistance region 40 via cross-hatched contact holes of rectangular form shown in FIG. 10. These contact holes are, of course, formed in the insulator film 18. Further, a conductor pattern 45 carrying a low or ground level voltage is provided on the second insulator film 35 so as to cross the resistance region 40.

In such a construction, it will be understood from the cross-sectional view of FIG. 11 that the parasitic MOS transistors MOS1 and MOS2 are formed between one of the isolation regions 24 and the resistance region 40 and between the other of the isolation regions 24 and the resistance region 40. In order to eliminate the turning-on of the parasitic MOS transistors MOS1 and MOS2, the positive side conductor pattern 42 is extended so as to cover the part of the resistance region 40 on which the conductor pattern 45 passes.

FIG. 11 shows a cross-sectional view of FIG. 10 taken along a line 11—11′. Referring to FIG. 11, it will be seen that the positive side conductor pattern 42, provided on the first insulator film 28, is located underneath the conductor pattern 45 separated by the second insulator film 35. As the voltage applied to the conductor pattern 42 is equal to the voltage applied to the resistance region 40, the turning-on of the parasitic MOS transistors MOS1 and MOS2 is prevented even when a low level voltage such as the ground level voltage is applied to the conductor pattern 45.

In this construction, too, the turning-on of the parasitic MOS transistors is eliminated by the two-layer construction without providing separate voltage source for biasing the conductor pattern 42.

The foregoing construction is also applicable to the case where the conduction type of various regions is reversed. In other words, the isolation region 24, the emitter region 25, the collector region 26 and the resistance region 40 may doped to the n-type, and the epitaxial layer 23 and the base contact region 27 may be doped to the p-type.

Further, the present invention is not limited to these embodiments described heretofore, but various variations and modifications may be made without departing from the scope of the invention.

What is claimed is:

1. A bipolar transistor having a base, an emitter and a collector, the base connected to one of an emitter and a collector to form a diode, comprising:
   a semiconductor layer of a first conductivity type, said semiconductor layer having upper and lower major surfaces and defined with a device region of the first conductivity type, the device region serving as a base region of the bipolar transistor and having an upper major surface coincident to the upper major surface of the semiconductor layer;
   an isolation region of a second, opposite conductivity type, said isolation region having an upper major surface coincident to the upper major surface of the semiconductor layer and formed in the semiconductor layer such that the isolation region surrounds the device region;
   an emitter region of the second conductivity type formed in a part of the device region, said emitter region having an upper major surface coincident to the upper major surface of the semiconductor layer;
   a collector region of the second conductivity type and formed in part of the device region with a separation from the emitter region between the emitter region and isolation region, said collector region having an upper major surface coincident to the upper major surface of the semiconductor layer;
   a first insulator layer having upper and lower major surfaces and provides on the upper major surface of the semiconductor layer;
   a first contact hole formed in the first insulator layer in correspondence to the emitter region for exposing the upper major surface of the emitter region;
   a second contact hole formed in the first insulator layer in correspondence to the collector region for exposing the upper major surface of the collector region;
   a third contact hole formed in the first insulator layer in correspondence to the base region for exposing the upper major surface of the base region;
   a first conductor pattern having upper and lower major surfaces and provided on the upper major surface of the insulator layer in correspondence to the emitter region with an electrical contact to the emitter region;
   a second conductor pattern having upper and lower major surfaces and provided on the upper major surface of the insulator layer in correspondence to the collector region with an electrical contact to the collector region;
   a third conductor pattern having upper and lower major surfaces and provided on the upper major surface of the insulator layer in correspondence to the base region with an electrical contact to the base region;

a second insulator layer having upper and lower major surfaces and provided on the upper major surface of the first insulator layer to bury the first through third conductor patterns;

a fourth contact hole formed in the second insulator layer in correspondence to the first conductor pattern for exposing the upper major surface of the first conductor pattern;

a fourth conductor pattern having upper and lower major surfaces and provided on the upper major surface of the second insulator layer, said fourth conductor pattern being provided with an electrical contact on the exposed upper major surface of the first conductor pattern and extending on the upper major surface of the second insulator layer from a first part thereof located above the emitter region to a second part thereof located above the isolation region, passing over a part of the collector region, said fourth conductor pattern forming a parasitic MOS transistor in a part of the device region located under the fourth conductor pattern and defined between the emitter region and said part of the collector region located under the fourth conductor pattern, and another parasitic MOS transistor in a part of the device region located under the fourth conductor pattern and defined between said part of the collector region under the fourth conductor pattern and the isolation region also located under the fourth conductor pattern;

said second conductor pattern extending on the upper major surface of the first insulator layer at least over a part of the device region wherein the parasitic MOS transistors are formed; and means for applying a predetermined voltage to said second conductor pattern, said predetermined voltage being chosen such that a turning-on of the parasitic MOS transistors is eliminated;

said second conductor pattern and said third conductor pattern being connected with each other to form a common conductor pattern.

2. A bipolar transistor as claimed in claim 1, wherein said collector region is formed to surround the emitter region when viewed in a direction perpendicular to the upper major surface of the semiconductor layer.

3. A bipolar transistor as claimed in claim 1, wherein said second conductor pattern and said third conductor pattern are connected with each other to form a common conductor pattern.

* * * * *

UNITED STATES PATENT AND TRADEMARK OFFICE
CERTIFICATE OF CORRECTION

PATENT NO. : 5,204,543
DATED : Apr. 20, 1993
INVENTOR(S) : HANAZAWA et al.

It is certified that error appears in the above-indentified patent and that said Letters Patent is hereby corrected as shown below:

TITLE PAGE: [73] Assignees, change "VSLI" to --VLSI--.

Col. 4, line 6, change "3'3'" to --3-3'--;
line 43, change "$2_3$" to --$12_3$--.

Signed and Sealed this

Seventeenth Day of June, 1997

Attest:

BRUCE LEHMAN

Attesting Officer

Commissioner of Patents and Trademarks